March 12, 1968 J. R. HOWIE 3,372,455

COMMON MULTIPLE PARTS LOCATING SYSTEM

Filed Oct. 6, 1965

INVENTOR.
JAMES R. HOWIE
BY *Elliott & Pastoriza,*
ATTORNEYS.

3,372,455
COMMON MULTIPLE PARTS LOCATING SYSTEM
James R. Howie, 20445 Roscoe Blvd., Canoga Park, Calif. 91306
Filed Oct. 6, 1965, Ser. No. 493,358
2 Claims. (Cl. 29—203)

ABSTRACT OF THE DISCLOSURE

This disclosure relates to an apparatus for facilitating the insertion of electrical components in a printed circuit board. The apparatus comprises a light box having an upper portion with openings for registration with the openings in the circuit board into which electrical components are to be inserted. Several templates are provided corresponding in number to the number of different types of multiple components to be inserted. Thus a template for all resistances of the same type is provided with openings positioned to register only with the particular openings in the circuit board for receiving resistances of like value. Insertion of the template between the light source and the openings in the enclosure and positioning the printed circuit board over the openings in the enclosure in registration therewith will result in light only being permitted to shine through certain openings in the circuit board. These openings are thus conspicuously designated and an operator may take a handful of resistances and simply insert them into the lighted openings until no light is visible. The template may then be removed and a template for another group of multiple components such as like condensers inserted in the enclosure so that light will only be permitted to shine through the openings in the circuit board for receiving condensers. The process is repeated with the other templates until the circuit board is properly filled with all of the components for the particular circuit in question.

This invention relates generally to a system for locating common multiple components in assembly operations, and more particularly to a method and apparatus for locating common multiple components on a printed circuit board.

While the method and apparatus is applicable to a wide variety of assembling operations, the preferred embodiment will be described in conjunction with the assembly of printed circuit boards.

Printed circuit boards usually include a number of different sets of various components, the components in any one set being multiple in number and similar to each other such as a set of resistors of like value, a set of transistors of a specified type or rating, and the like secured to the board. Each component has a location depending on the design and function of the circuit.

Present methods of assembling the components on a circuit board are slow and require skilled labor in that the location of the position in which each individual component is to be mounted on the circuit board must be found and identified and then the proper component installed in that position. These steps are repeated for each component until all of the required components are positioned on the circuit board ready for soldering. The entire process is not only slow but requires personnel having at least some knowledge of the circuitry of the circuit board in order to properly locate and position the correct components thereon.

With the foregoing in mind, it is accordingly a primary object of this invention to provide a novel method and apparatus for locating and identifying the positions in which components are to be mounted on a printed circuit board to the end that the assembly of circuit boards may be more quickly and easily accomplished than heretofore.

Another object is to provide a novel method and apparatus meeting the foregoing object and which insures more accurate placement of the components on a circuit board.

Still another object is to provide a novel method and apparatus meeting the foregoing objects and which eliminates the need for highly skilled assembly personnel.

Briefly, these and many other objects and advantages of this invention are attained by providing an enclosure having a light source mounted therein. A top portion of the enclosure is provided with a plurality of openings through which light from the light source is visible. These openings are positioned to coincide with openings drilled through a circuit board which is removably positioned on the top of the enclosure. The openings in the circuit board are positioned to receive lead wires connected to resistors, transistors, and the like adapted to be mounted on the circuit board.

The enclosure is provided with means for slidably receiving a template between the light source and the top portion of the enclosure. The template is provided with a plurality of openings therethrough corresponding in number and position to selected openings in the circuit board adapted to receive a particular set of common multiple components such, for example, as all the resistors. By this arrangement, light will appear through only the selected openings, thus locating and identifying the positions in which the components of one set are to be mounted on the circuit board. Another template having a plurality of openings corresponding to the openings in the board onto which another set of common multiple components is to be located, such as transistors, is then substituted for the first template and the positions for the components in this other set are thus identified, and so forth.

A better understanding of the invention will now be had by referring to a preferred embodiment thereof as illustrated in the accompanying drawings, in which.

Figure 1:
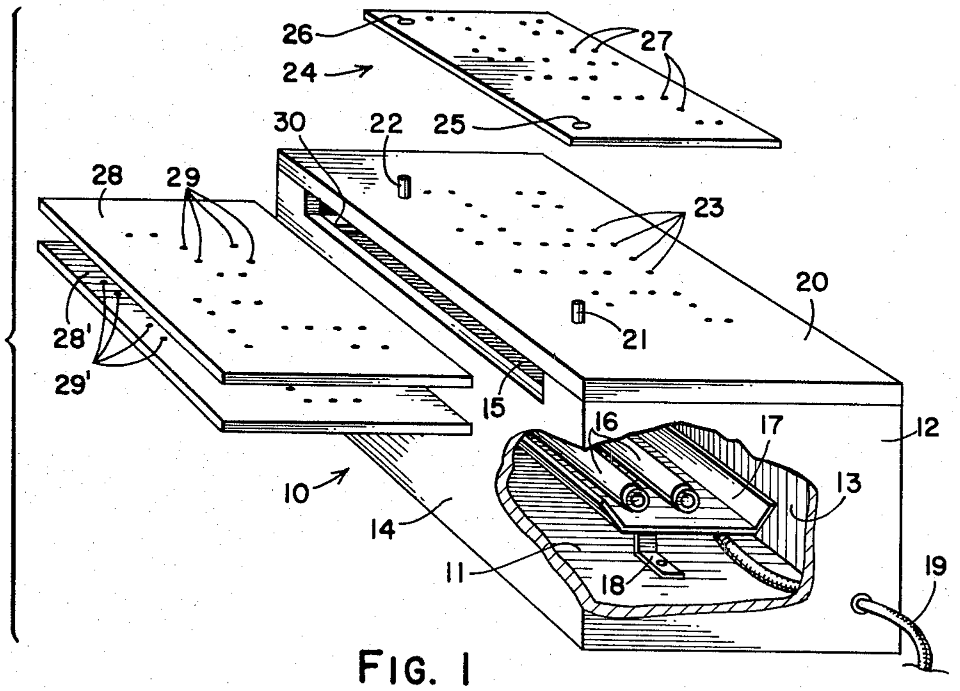
FIGURE 1 is a perspective view, partly broken away, of the apparatus of the invention in position to receive a circuit board and template.

Referring first to FIGURE 1, there is shown a box-like enclosure 10 including a bottom wall 11, an end wall 12, and side walls 13 and 14, respectively. Defined within the side wall 14 along the upper edge thereof is a longitudinal slot 15. Positioned within the enclosure 10 are a pair of fluorescent lights 16 mounted within a frame 17 secured to the bottom wall 11 by means of brackets 18. An electrical cord 19 is connected to the light source and extends outwardly from the enclosure through the end wall 12 as shown. A plate 20 made, for example, of "Bakelite" is positioned on the side walls and end walls to form the top portion of the enclosure 10. The plate 20 includes a pair of upwardly projecting studs 21 and 22, respectively, as shown. The plate 20 further includes a plurality of first openings 23.

A printed circuit board 24 is shown above the enclosure 10 prior to being positioned on the top plate 20. This circuit board includes a pair of openings 25 and 26 adapted to receive the studs 21 and 22, respectively, when the circuit board is mounted on the plate 20. The circuit board includes a plurality of second openings 27 adapted to receive the lead wires connected to the resistors, transistors, and the like which are to be mounted on the circuit board and subsequently soldered thereto.

The openings 23 defined within the plate 20 are positioned so as to register with the circuit board openings 27 such that when the circuit board is mounted on the plate 20 light emitted from the fluorescent light source 16 will be visible through the registering openings 23 and 27.

A template 28, made for example of aluminum, is shown prior to being inserted through the slot 15 into the enclosure 10. In accordance with the invention, the template 28 is provided with a plurality of third openings 29 corresponding in number and position to those openings in the circuit board 24 adapted to receive a specified first set of common multiple components; for example, a set of resistors of like value. As shown, a second template 28' is adapted to be inserted within the enclosure after the first template 28 has been withdrawn therefrom. The template 28' is provided with a plurality of fourth openings 29' corresponding in number and position to those openings in the circuit board 24 adapted to receive a second set of common multiple components; for example, a set of transistors of a specified rating.

The circuit board 24 is assumed to have been designed to require several different sets of common multiple components such as a set of resistors, a set of transistors, and the like. The openings 27 are drilled through the circuit board at the points where the lead wires of the resistors and transistors are to be received.

Figure 2:
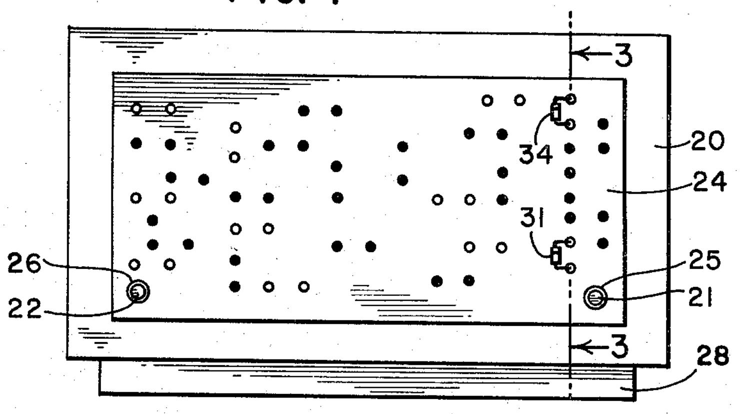
FIGURE 2 is a plan view of the apparatus with a circuit board mounted thereon; and, FIGURE 3 is a fragmentary cross-section of the apparatus in the direction of the arrows 3—3 of FIGURE 2.
Figure 3:
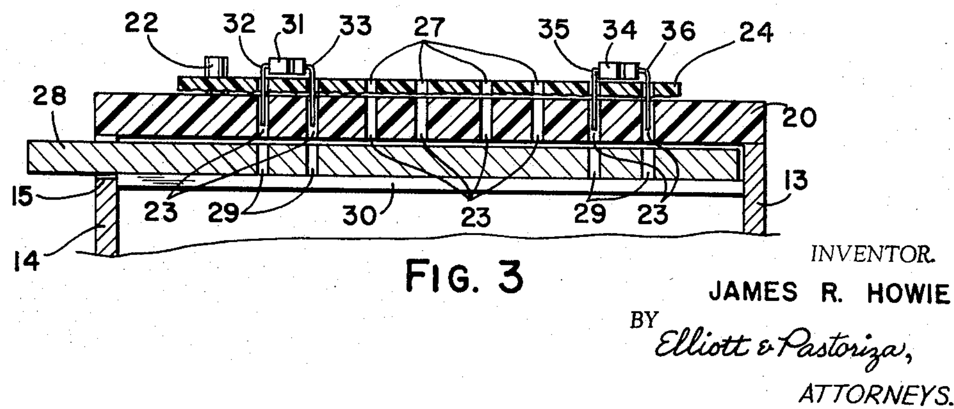

In accordance with the method and apparatus of this invention and with reference to FIGURES 2 and 3, the circuit board 24 is positioned on the plate 20 with the studs 21 and 22 being received within the openings 25 and 26, respectively. The template 28 is then inserted within the slot 15 and moved within the enclosure 10 on slide rails, one of which is shown at 30 in FIGURE 3 extending between the side walls 13 and 14. The fluorescent lights 16 are then turned on and the light therefrom will be visible from above the plate 20 through only those openings 23 and 27 which are in registration with the openings 29 defined through the template 28.

Thus, as shown in FIGURE 2, the light will be visible through those openings shown as circles and will not be visible through the openings shown as being darkened. The operator is thus immediately aware of the openings within which all of the resistors are to be inserted, and may simply position resistors such as shown at 31 and 34 within the lighted openings by means of inserting the respective lead wires 32, 33 and 35, 36 therein. This procedure is continued until all of the lighted openings have received resistors.

Next, the operator removes the template 28 showing the locations of the resistors and substitutes the second template 28', which as above stated, is provided with openings 29' corresponding to openings in the circuit board adapted to receive a set of other multiple common components, such as all of the transistors. The above-described procedure is then repeated with transistors. If desired, the respective templates may be marked with data describing the type and number of multiple components to be installed in conjunction with each template, thereby insuring the installation of the proper components.

When all of the components have been mounted on the circuit board, it is simply lifted off the plate 20 and transferred to the next operation wherein the lead wires are soldered to the circuit board in the conventional manner.

From the foregoing description, it is apparent that this invention provides a simple and efficient method and apparatus for locating the positions in which common multiple components may be mounted on a printed circuit board. This invention greatly increases the speed and accuracy with which circuit boards are assembled since the operator need only reach into a single box containing all resistors and assemble these and, then, after substituting templates, reach into another single box containing all transistors and assemble these, and so forth. Heretofore, an operator might first position a resistor and then a transistor and then another resistor, and there was thus a chance for error or confusion unless the operator was skilled and familiar with the circuit. With the present system, there is no need for skilled personnel and the operation can be carried out in far less time than heretofore required.

Various changes falling within the scope and spirit of this invention will occur to those skilled in the art. The locating system is therefore not to be thought of as limited to the specific embodiment set forth.

What is claimed is:

1. An apparatus for locating the positions in which a specified set of common multiple components is to be mounted on a board, comprising: an enclosure including a light means, a portion of said enclosure including a plurality of openings through which light from said light means is visible; a board having a plurality of openings; means for indexing the position of said board on said enclosure so that its openings register with said openings in said enclosure; a template; and means in said enclosure for receiving and guiding said template to a position between said light means and said portion of said enclosure, said template having a plurality of openings therethrough registering only with selected openings in said board for permitting light to be visible through said selected openings thereby indicating the positions in which said components are to be mounted on said board, said template being removable from within said enclosure whereby a second template having a different plurality of openings may be inserted within said enclosure for indicating the positions in which a second set of components may be mounted on said board.

2. A locating system for locating the positions in which a specified set of common multiple components is to be mounted on a circuit board, comprising: a box-like enclosure including a side wall having a longitudinal slot defined therein; a fluorescent light source positioned within said enclosure; a plate forming the top of said enclosure and having a plurality of first openings defined therein, said plate further having a pair of upwardly projecting studs; a printed circuit board positioned on said plate and having a pair of openings defined therethrough receiving said projecting studs, said circuit board including a plurality of second openings defined therethrough registering with said first openings whereby light from said light source is visible through said openings; and a template positioned in said slot and extending within said enclosure between said light source and said plate, said template including a plurality of third openings defined therethrough corresponding in number and position to selected openings in said circuit board adapted to receive said specified set of common multiple components, whereby light from said light source will be visible through only said selected openings, thereby locating the positions in which said components are to be mounted on said circuit board.

References Cited

UNITED STATES PATENTS 2,959,848 11/1960 Savitt ---------------- 29—407
3,216,101 11/1965 Miller -------------- 29—626 X THOMAS H. EAGER, *Primary Examiner.*